(12) United States Patent
Kuo et al.

(10) Patent No.: US 12,198,956 B2
(45) Date of Patent: Jan. 14, 2025

(54) SEMICONDUCTOR STORAGE APPARATUS WITH INTEGRATED SORTER

(71) Applicant: TAIWAN SEMICONDUCTOR MANUFACTURING COMPANY LIMITED, Hsin-Chu (TW)

(72) Inventors: Tsung-Sheng Kuo, New Taipei (TW); Chih-Chun Chiu, Zhudong Township (TW); Chih-Chieh Fu, Taipei (TW); Chueng-Jen Wang, Tainan (TW); Hsuan Lee, Tainan Science Park Tainan (TW); Jiun-Rong Pai, Jhubei (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 1127 days.

(21) Appl. No.: 16/944,412

(22) Filed: Jul. 31, 2020

(65) Prior Publication Data

US 2022/0037178 A1 Feb. 3, 2022

(51) Int. Cl.
*H01L 21/67* (2006.01)
*H01L 21/673* (2006.01)
*H01L 21/677* (2006.01)

(52) U.S. Cl.
CPC .. *H01L 21/67271* (2013.01); *H01L 21/67294* (2013.01); *H01L 21/67303* (2013.01);
(Continued)

(58) Field of Classification Search
CPC ......... H01L 21/67271; H01L 21/67294; H01L 21/67303; H01L 21/67379; H01L 21/6773; H01L 21/67769
See application file for complete search history.

(56) References Cited

U.S. PATENT DOCUMENTS 6,471,460 B1 * 10/2002 Pedersen ........... H01L 21/67173
414/749.5
6,647,616 B1 11/2003 Matsumura et al.
(Continued)

FOREIGN PATENT DOCUMENTS

CN 1260905 A 7/2000
CN 110783244 A 2/2020

OTHER PUBLICATIONS

First Office Action received in corresponding Chinese patent application No. 202110171815.6, dated Jul. 10, 2024, 14 pages.

*Primary Examiner* — Gerald McClain
(74) *Attorney, Agent, or Firm* — Cooper Legal Group, LLC

(57) ABSTRACT

An apparatus, system and method for storing die carriers and transferring a semiconductor die between the die carriers. A die stocker includes a rack enclosure with an integrated sorting system. The rack enclosure includes storage cells configured to receive and store die carriers having different physical configurations. A transport system transports first and second die carriers between a first plurality of storage cells and a first sorter load port, where the transport system introduces the first and second die carriers to a first sorter. The transport system transports third and fourth die carriers between a second plurality of storage cells and a second sorter load port, where the transport system introduces the third and fourth die carriers to a second sorter. The first and second die carriers have a first physical configuration, and the third and fourth die carriers have a second physical configuration, different than the first physical configuration.

20 Claims, 11 Drawing Sheets

(52) U.S. Cl.
CPC .... *H01L 21/67379* (2013.01); *H01L 21/6773* (2013.01); *H01L 21/67769* (2013.01)

(56) References Cited

U.S. PATENT DOCUMENTS

| | | |
|---|---|---|
| 11,024,526 B2* | 6/2021 | Rebstock .......... H01L 21/67393 |
| 11,222,802 B1* | 1/2022 | Huang .................. B23Q 16/00 |
| 2008/0317565 A1* | 12/2008 | Menser, Jr. ....... H01L 21/67775 |
| | | 414/806 |
| 2010/0278622 A1 | 11/2010 | Huang et al. |
| 2014/0127880 A1 | 5/2014 | Grivna |
| 2014/0308108 A1* | 10/2014 | Fosnight .......... H01L 21/67379 |
| | | 414/800 |
| 2015/0187622 A1 | 7/2015 | Johnson et al. |
| 2016/0013087 A1* | 1/2016 | Yoshioka .......... H01L 21/67727 |
| | | 414/659 |
| 2019/0206709 A1* | 7/2019 | Li ..................... H01L 21/67769 |
| 2020/0043758 A1* | 2/2020 | Kuo ..................... B65G 1/1373 |
| 2020/0075378 A1 | 3/2020 | Chiu et al. |
| 2021/0098275 A1* | 4/2021 | Li ....................... B65D 81/022 |

\* cited by examiner

SEMICONDUCTOR STORAGE APPARATUS WITH INTEGRATED SORTER

BACKGROUND

Semiconductor fabrication processes, such as very-large-scale integration (VLSI), create integrated circuits by forming networks of transistors and other circuit components on a single chip, commonly referred to as a die. Several dies can be formed on a single wafer, or dies can be processed individually after being cut from a wafer. Due to the number of circuit components included in modern integrated circuits, the fabrication processes have become increasingly complex. Dies, whether formed as part of a wafer or having been cut from a wafer, are transported to various different treatment chambers, process tools, and fabrication bays to be subjected to a sequence of processing operations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
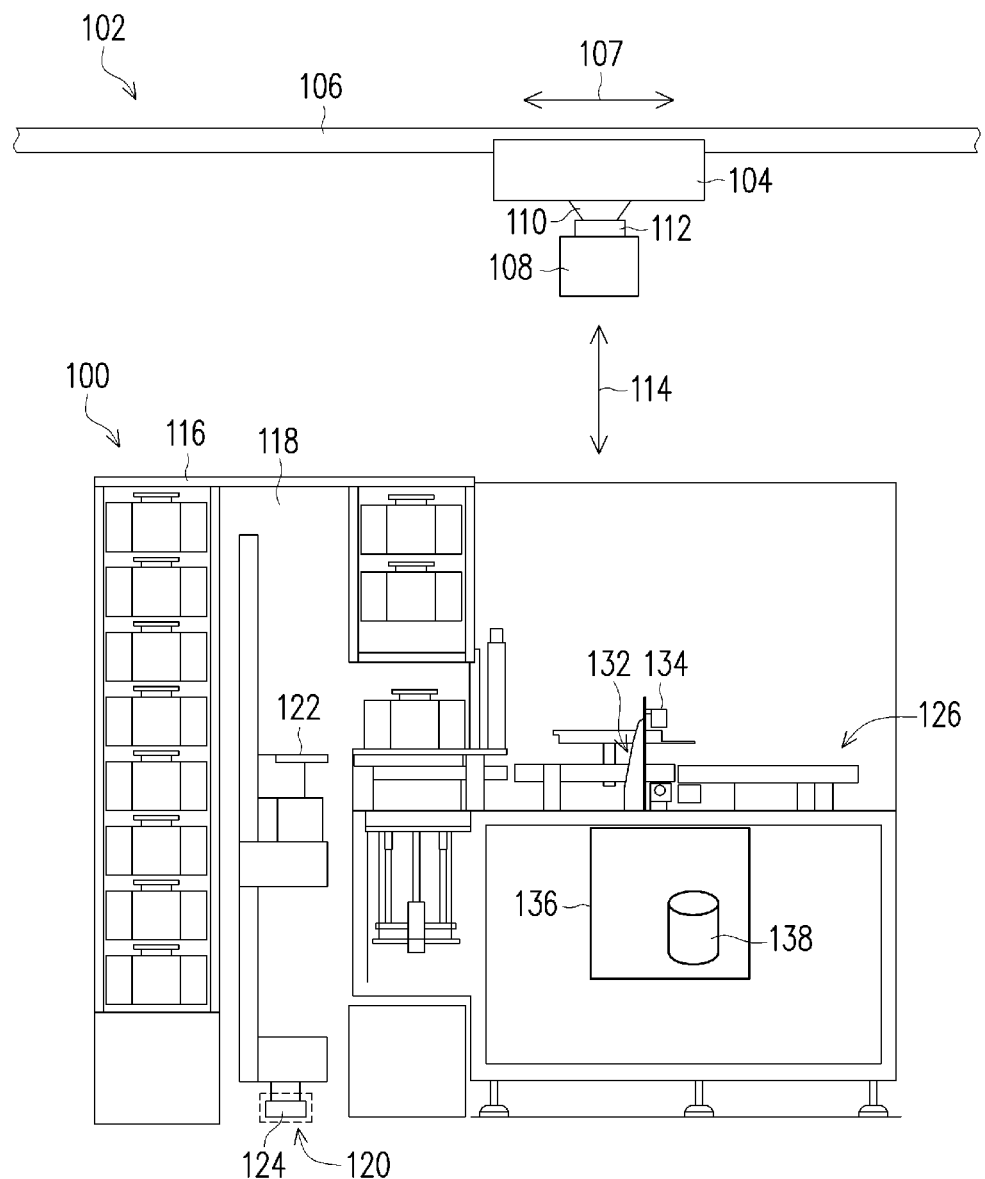
FIG. 1 illustrates a fabrication system comprising a die stocker comprising an integrated sorter functionality, and an overhead hoist transfer system, in accordance with some embodiments.

The following disclosure provides many different embodiments, or examples, for implementing different features of the provided subject matter. Specific examples of components and arrangements are described below to simplify the present disclosure. These are, of course, merely examples and are not intended limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

During electronic circuit fabrication, intricate processing operations require more time to complete than simple processing operations, causing bottlenecks where the intricate processing operations are performed. The progression of semiconductor dies through the fabrication process is also interrupted intentionally, such as when an insufficient number of process tools are available, etc. and unintentionally, such due to unexpected issues that arise during fabrication, etc. As a result, backlogs of semiconductor dies accumulate at various points during the fabrication process. In some embodiments, in an effort to protect against the introduction of contaminants to the integrated circuits at rest, for example, semiconductor dies are stored as "works in process" in a controlled environment within a rack enclosure of a die stocker between processing operations.

Complex fabrication systems employ a plurality of different die carriers, having different physical configurations, to carry the semiconductor dies between processing equipment at different locations within a fabrication process. Some embodiments of the different die carriers include, but are not limited to, tray cassettes and boat magazines. An example of a difference between tray cassettes and boat magazines is the base portions of the die carriers are different. In some embodiments, one of the die carriers comprises a base portion that cooperates with a kinematic coupling guide provided to a first die sorter, and the other die carrier comprises a base portion that cooperates with a cone guide provided to a second die sorter.

Another example of a difference between the die carriers is the structure of each die carrier that supports the trays and boats that carry the semiconductor dies. According to some embodiments, the trays are stacked in an interior of a tray cassette, such that a first tray is arranged vertically above, and rests on top of a second, underlying tray. In some embodiments, a boat magazine comprises one or more flanges that separately supports a first boat vertically above, and spaced apart from an underlying second boat. In other words, in some embodiments, the underlying tray in a tray cassette supports the weight of the tray resting atop the underlying tray, while the underlying boat contained by the boat magazine does not support the boat arranged vertically above the underlying boat. Instead, in some embodiments, the boats are vertically spaced apart from each other in the magazine.

To accommodate different die carriers and protect against the introduction of contaminants into the semiconductor dies at rest between fabrication processes, for example, in some embodiments, a die stocker, method, and system comprise a rack enclosure that receives and temporarily stores a plurality of different die carriers containing the semiconductor dies. The die stocker comprises a plurality of different storage cells. In accordance with some embodiments, at least a first storage cell is configured to receive and support a first die carrier, and at least a second storage cell is configured to receive and support a second die carrier, having a different physical configuration than the first die carrier.

According to some embodiments, an integrated sorting system imparts to the rack enclosure a die transfer functionality that conveys a semiconductor die between two die carriers. In some embodiments, the sorting system comprises a separate sorter integrated as a portion of the rack enclosure for the different physical configurations of die carrier stored by the rack enclosure. For example, in accordance with some embodiments, a first sorter is provided to the rack enclosure to transfer a semiconductor die between a plurality of tray cassettes. According to some embodiments, a second sorter is provided to the rack enclosure, to transfer a semiconductor die between a plurality of boat magazines, for example. In some embodiments, by integrating the sorting system as a portion of the rack enclosure of the die stocker, semiconductor dies are transferred between die carriers by the sorting system without the die carriers being transported to a separate, stand-alone sorter by a transport device external of at least one of the die stocker or rack system.

With reference to the drawings, FIG. 1 illustrates a fabrication system comprising a die stocker 100 comprising an integrated sorter functionality and an overhead hoist transfer system 102, in accordance with some embodiments. In some embodiments, the overhead hoist transfer system 102 comprises one or more transport vehicles 104 that travels along a track 106. In some embodiments, the track 106 is suspended from and extends along a ceiling or other overhead structure of a fabrication facility in which semiconductor dies are processed. In some embodiments, the transport vehicles 104 cooperate with die carriers 108 to carry or otherwise transport the die carriers 108 between various workstations and processing machines.

In some embodiments, the track 106 defines a path traveled by the transport vehicle 104 in the direction of arrow(s) 107 from an origin, where a die carrier 108 is retrieved, to a destination, where the die carrier 108 is deposited. According to some embodiments, the transport vehicles 104 comprise a motor drive that drives a wheel, gear or other drive member to move the transport vehicles 104 along the track 106. According to some embodiments, the transport vehicles 104 lack a drive member, and instead the transport vehicles 104 comprise a latch link that couples the transport vehicles 104 to a drive system provided to or in the track 106. For example, the drive system provided to or in the track 106 comprises, but is not limited to, a drive chain that cooperates with a drive gear to cause the drive chain to move along the track 106. In some embodiments, a hook provided to the transport vehicles 104 can engage the drive chain, causing the transport vehicles 104 to move along the track 106 with the chain.

According to some embodiments, the drive system provided to the track 106 comprises an array of electromagnets that, when energized by an electric current, generate a magnetic field. In some embodiments, a fixed magnet provided to the transport vehicles 104 is expelled away from the generated magnetic field, causing the transport vehicles 104 to travel along the track 106. The above examples of the drive system for moving the transport vehicles 104 along the track 106 are merely some examples, and not an exhaustive list of suitable drive systems.

In some embodiments, the transport vehicle 104 comprises a hoist 110 that is configured to change an elevation of the die carrier 108 being transported in the direction of arrow(s) 114. In some embodiments, the hoist 110 comprises a connector that cooperates with a head 112 provided to the die carrier 108 to couple the die carrier 108 to the transport vehicle 104. According to some embodiments, the hoist 110 comprises a motor-driven winch that unspools one cable or a plurality of cables to lower the die carrier 108 and spools the cable(s) to elevate the die carrier 108 towards the transport vehicle 104.

In some embodiments, to deliver the die carrier 108 to the die stocker 100, the transport vehicle 104 travels along the track 106 to a location where the die carrier 108 is positioned vertically above a shelf 202 (FIG. 2) of a load port 204, through which the die carrier 108 is to be introduced into a rack enclosure 116 of the die stocker 100. In some embodiments in which the hoist 110 that utilize a winch with one or more cables, the hoist 110 is activated to unspool the cable(s), thereby lowering the die carrier 108 onto the shelf 202 of the load port 204, for example.

Some embodiments of the die stocker 100 comprise a rack enclosure 116 that stores the die carriers 108 having a plurality of different physical configurations. In some embodiments, the rack enclosure 116 comprises at least one, or a plurality of first storage cells 206 (FIG. 2) configured to receive and store one or a plurality of first die carriers 108 having a first physical configuration. According to some embodiments, the first storage cells 206 are configured to receive and store die carriers 108 in the form of tray cassettes 300, described below with reference to FIGS. 3 and 4. According to some embodiments, the first storage cells 206 are configured to receive and store a die carrier 108 in the form of boat magazine 500, described below with reference to FIGS. 5 and 6. In some embodiments, the first storage cells 206 are configured specifically for one of the tray cassettes 300 or the boat magazines 500, and are incompatible with the other type of die carrier 108.

Some embodiments of the rack enclosure 116 comprise at least one, or a plurality of second storage cells 208 (FIG. 2) configured to receive and store one or a plurality of second die carriers 108 having a second physical configuration. The first physical configuration of the first die carrier 108 is different from the second physical configuration of the second die carrier 108. For example, the first die carrier can be a tray cassette 300, which has a different physical construction than a boat magazine 500 as the second die carrier.

Figure 3:
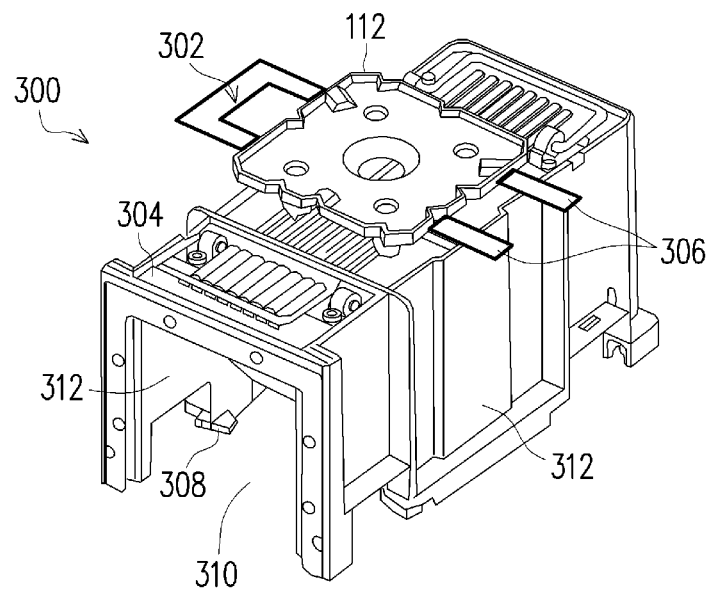
FIG. 3 is a perspective view of a tray cassette and a coupler cooperating with a head of the tray cassette, in accordance with some embodiments.
Figure 7:
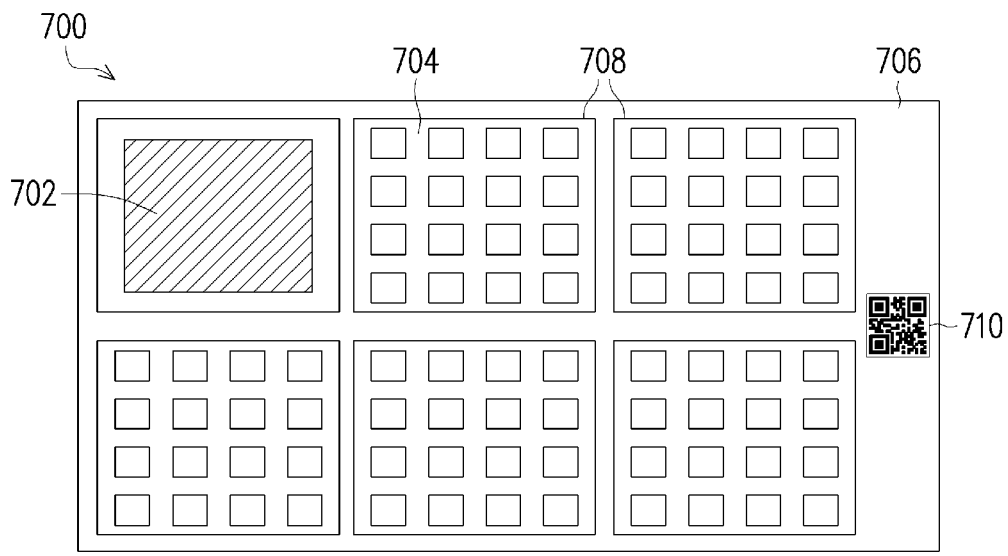
FIG. 7 is a top view of a tray that supports a plurality of semiconductor dies, in accordance with some embodiments.

FIG. 3 is a perspective view of the tray cassette 300, in accordance with some embodiments. In some embodiments, the tray cassette 300 is configured to receive a plurality of trays 700, an example of which is illustrated in FIG. 7. In some embodiments, in the tray cassette 300, the tray 700 at a bottom of a stack is supported by a set of flanges 308 (FIGS. 3 and 4) that extend inward, into an aperture 310 defined by side surfaces 312 and a top surface 304 of the tray cassette 300. In some embodiments, a second tray 700 comprised in the stack is placed vertically on top of the tray 700 at the bottom of the stack and is supported by the tray 700 at the bottom of the stack. In some embodiments, additional trays 700 comprised in the stack are similarly supported on top of the second tray 700, resting on top of the second tray 700. In some embodiments, the trays 700 comprised in a stack supported within a tray cassette 300 are arranged in vertical alignment but are not spaced apart from the immediately-underlying tray 700. Instead, in some embodiments, the trays 700 in the stack rest upon and are supported by the underlying trays 700.

Figure 5:
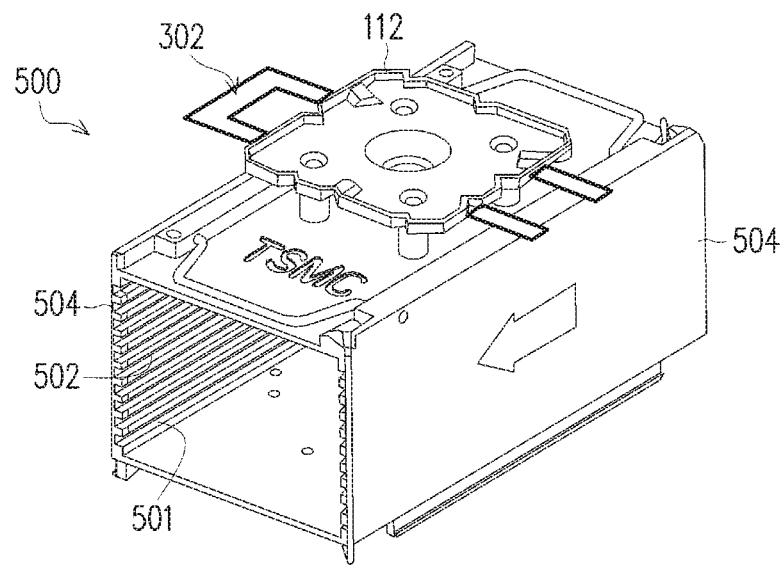
FIG. 5 is a perspective view of a boat magazine and a coupler cooperating with a head of the boat magazine, in accordance with some embodiments.
Figure 8:
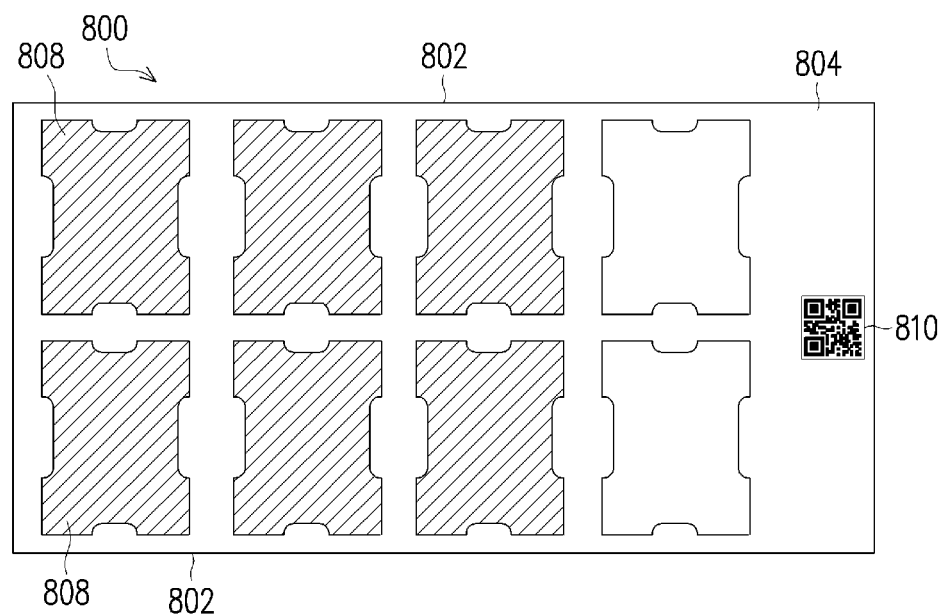
FIG. 8 is a top view of a boat that supports a plurality of semiconductor dies, in accordance with some embodiments.

FIG. 5 is a perspective view of a boat magazine 500, in accordance with some embodiments. In some embodiments, the boat magazine 500 is configured to receive a plurality of boats 800, an example of which is illustrated in FIG. 8. In some embodiments, in the boat magazine 500, lateral edges 802 (FIG. 8) of the boats 800 are received in apertures 502 formed in lateral side walls 504 of the boat magazine 500. According to some embodiments, the apertures 502 extend longitudinally, along a substantial extent of the side walls 504, and opposing pairs of the apertures 502 are formed at a plurality of different vertical elevations along the side walls 504. In some embodiments, because the boats 800 are received in separate sets of the apertures 502, at different vertical elevations within the boat magazine 500, one boat 800 in the boat magazine 500 does not support the weight of a second boat 800 in the boat magazine 500. Instead, in some embodiments, a plurality of boat magazines 500 are independently supported by flanges 501 defining a bottom periphery of the apertures 502 formed in the side walls 504. Accordingly, in some embodiments, the boats 800 in the boat magazine 500 are vertically arranged one above another and are spaced apart from each other within the boat magazine 500. Thus, in some embodiments, boats 800 that are immediately adjacent to each other are not stored in contact with each other.

For the sake of brevity and clarity, the tray cassette 300 is used as an example of the first die carrier having a first physical configuration, and the boat magazine 500 is used as an example of the second die carrier having a second, different physical configuration from this point forward. Die carriers, inclusive of the tray cassette 300 and the boat magazine 500, are referred to generically herein as die carriers 108. However, it is to be understood that the present disclosure is not so limited. Die carriers 108 with physical configurations other than as tray cassettes 300 and boat magazines 500 are also encompassed by the terms first die carrier and the second die carrier, as well as generic references to die carrier 108.

In some embodiments, the first storage cells 206 are arranged in an array such as rows and columns, for example, or any other defined arrangement. Similarly, in some embodiments, the second storage cells 208 are arranged in an array such as rows and columns, for example, or any other defined arrangement. In some embodiments, arranging the first storage cells 206 and the second storage cells 208 in an array allows the location of each individual cell comprised among at least one of the first storage cells 206 or the second storage cells 208 to be mapped and determined using addresses designating the row and column that intersect at the individual cells, for example.

Figure 2:
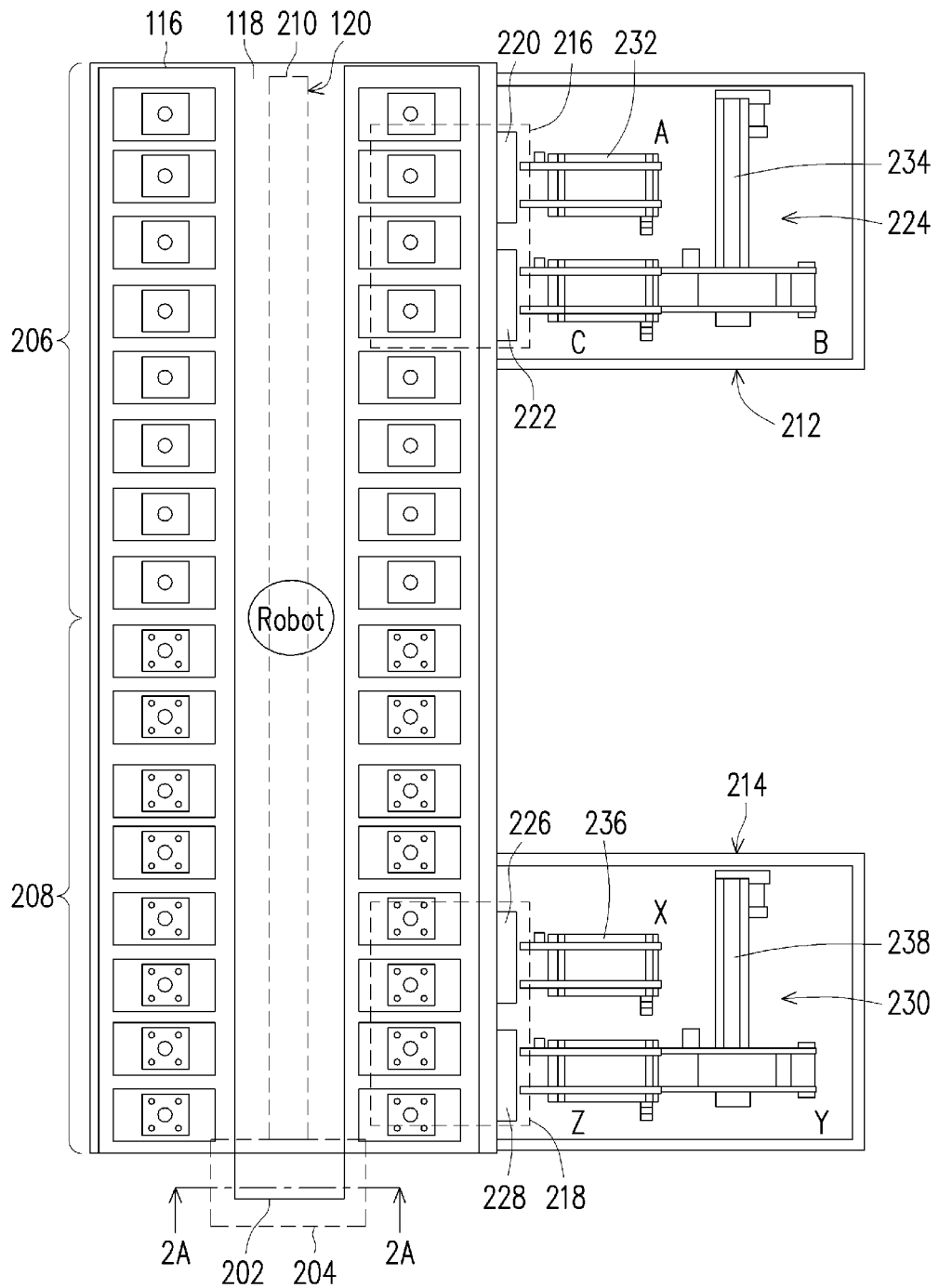
FIG. 2 is a top view of a die stocker with integrated sorter functionality, in accordance with some embodiments.

The first storage cells 206 and the second storage cells 208 are illustrated in FIG. 2 as being grouped together, as blocks of storage cells comprising cells for receiving and storing die carriers 108 having one physical configuration. However, some embodiments of the rack enclosure 116 comprise first storage cells 206 and second storage cells 208 in alternating arrangements, or random arrangements. Thus, arranging the first storage cells 206 and the second storage cells 208 into separate, distinct groupings is not required.

According to some embodiments, the first storage cells 206 and the second storage cells 208 are arranged on opposite sides of an aisle 118 (FIG. 1) of the rack enclosure 116. In some embodiments, a transport system 120 is disposed in the aisle 118 for transporting the tray cassette(s) 300 between the load port 204 and the first storage cell(s) 206 within the rack enclosure 116. According to some embodiments, the transport system 120 transports the boat magazines 500 between the load port 204 and the second storage cells 208 within the rack enclosure.

In some embodiments, arranging the first storage cells 206 and the second storage cells 208 on opposite sides of the aisle 118 allows the transport system 120 to access and transport tray cassettes 300 and boat magazines 500 stored by the first storage cells 206 and the second storage cells 208, respectively, on both sides of the aisle 118. According to some embodiments, the first storage cells 206 and the second storage cells 208 are arranged on a single side of the aisle 118 or in a non-linear arrangement.

Some embodiments of the transport system 120 comprise an arm 122 provided with a coupler 302 (FIGS. 3 and 5) that cooperates with the head 112 of the die carriers 108. In some embodiments, cooperation between the coupler 302 and the head 112 couples the die carriers 108 to the transport system 120 for delivery to one of the first storage cells 206 or one of the second storage cells 208, depending upon the physical configuration of the die carrier 108. For example, as illustrated in FIG. 3, the head 112 of the tray cassette 300 protrudes in an upward direction, generally away from the top surface 304 of the tray cassette 300. According to some embodiments, and as illustrated in FIG. 3, the coupler 302 comprises a fork with tines 306 spaced apart from each other. In some embodiments, adjusting the position of the arm 122 causes the tines 306 to extend into a space between the head 112 and the top surface 304 of the tray cassette 300, allowing the transport system 120 to remove the tray cassette 300 from the shelf 202 of the load port 204.

Some embodiments of the transport system 120 comprise a track 210, illustrated in broken lines in FIG. 2, along which the arm 122 of the transport system 120 can travel to access at least one of the first storage cells 206 or the second storage cells 208. In some embodiments, an arm drive 124 (FIG. 1) is operable to move the arm 122 along the length of the track 210. According to some embodiments, the arm drive 124 comprises a stepper motor arranged at a base of the arm 122. In some embodiments, the stepper motor is operable to rotate a drive shaft a defined number of rotations to move the arm 122 a known distance along the track 210. In some embodiments, the arm drive 124 comprises an electromagnetic drive system, a hydraulic or pneumatic actuator, etc. to move the arm 122 a known distance along the track 210.

Figure 2A:
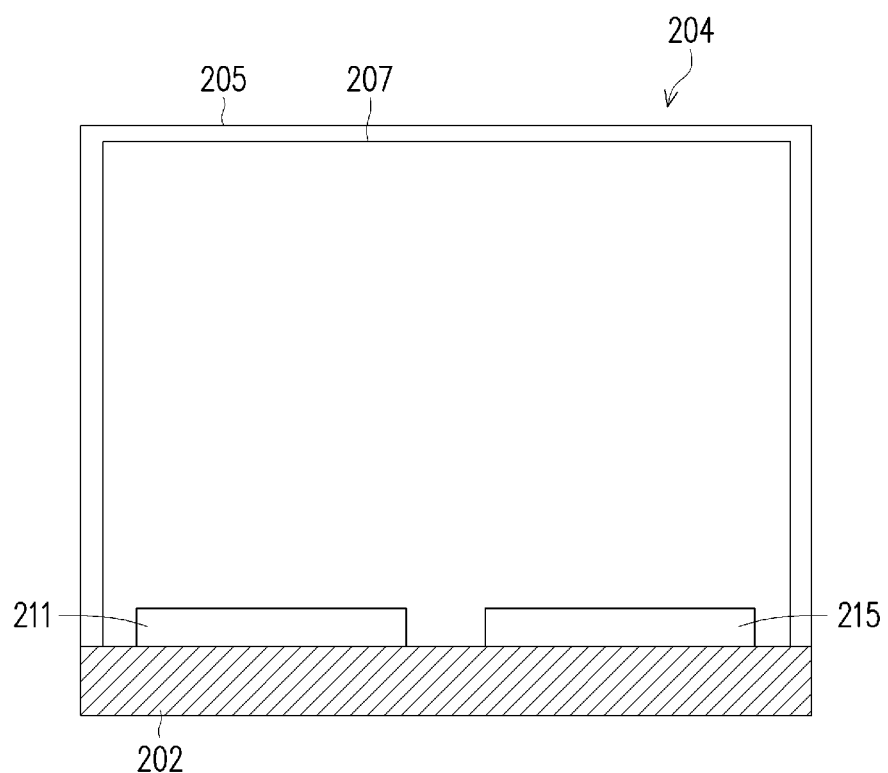
FIG. 2A is a sectional view of a load port of a rack enclosure taken along line 2A-2A in FIG. 2.
Figure 9A:
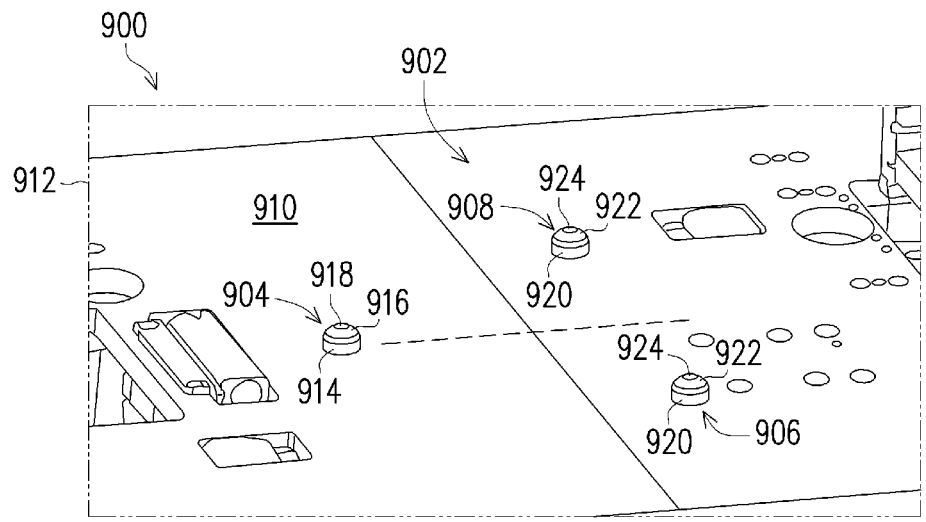
FIG. 9A is a perspective view of a guide for a sorter, the guide comprising a kinematic coupling interface, in accordance with some embodiments.

Referring to FIG. 2 and FIG. 2A, in some embodiments, the load port 204 comprises a frame 205 defining an aperture through which the die carriers 108 are introduced into an interior of the rack enclosure 116. According to some embodiments, a door 207 closes the aperture defined by the frame 205 to interfere with entry of potential contaminants into the rack enclosure 116. Some embodiments of the shelf 202 support a first load port guide 211 and a second load port guide 215. In some embodiments, the first load port guide 211 and the second load port guide 215 are configured to cooperate with portions of die carriers 108 delivered to the load port 204 by the overhead hoist transfer system 102. Similar to a first guide 220, a second guide 222, a third guide 226, or a fourth guide 228, some embodiments of the first load port guide 211 and the second load port guide 215 maintain the die carriers 108 in defined positions relative to the load port 204. In some embodiments, maintaining the die carriers 108 delivered to the load port 204 in the defined positions allows the transport system 120 to locate the die carriers 108, and cooperate with the die carriers 108 to transport the die carriers 108 between the load port 204 and the first storage cells 206 or the second storage cells 208, as described herein. In some embodiments, the first load port guide 211 and the second load port guide 215 are independently selected to comprise a kinematic coupling interface 902 (FIG. 9A and FIG. 9B) or a cone guide interface 1004 (FIG. 10A). According to some embodiments, the configuration of the first load port guide 211 is different from a configuration of the second load port guide 215, to cooperate with a different die carrier 108 than the second load port guide 215. According to some embodiments, the coupler 302 provided adjacent to a distal end of the arm 122 cooperates with the head 112 of the die carrier 108 deposited onto the shelf 202, coupling the die carrier 108 to the transport system 120. In some embodiments, the transport system 120 is operable to transport the die carrier 108 between the shelf and one of the first storage cells 206 or one of the second storage cells 208, depending on the physical configuration of the die carrier 108.

According to some embodiments, the die stocker 100 comprises a sorting system 126, as illustrated in FIGS. 1 and 2. Some embodiments of the sorting system 126 comprise a first sorter 212 and a second sorter 214. In some embodiments, a first sorter load port 216 extends between the interior of the rack enclosure 116 and the first sorter 212, defining an aperture through which die carriers 108 are delivered by the transport system 120 to the first sorter 212. In some embodiments, the transport system 120 delivers die carriers 108 to the first sorter 212 through the first sorter load port 216. Thus, the plurality of die carriers 108 are delivered to the first sorter 212 by the transport system 120 that also transports the die carriers 108 between the load port 204 and the first storage cells 206 and second storage cells 208, thereby integrating the sorting function as part of the rack enclosure 116 and allowing the transfer of semiconductor dies between die carriers 108 at the rack enclosure 116 as described herein. In some embodiments, a separate transport device, external of the rack enclosure 116, is not required to transport the die carriers 108 to a separate sorting system, removed from the rack enclosure 116.

Some embodiments of the sorting system 126 comprise a second sorter load port 218 that extends between the interior of the rack enclosure 116 and the second sorter 214. In some embodiments, the second sorter load port 218 comprises a frame that defines an aperture through which die carriers 108 can be delivered by the transport system 120 to the second sorter 214. In some embodiments, the second sorter load port 218 enables delivery of a plurality of die carriers 108 to the second sorter 214 by the transport system 120 that transports the die carriers 108 between the load port 204 and the first storage cells 206 and second storage cells 208, thereby integrating the sorting function as part of the rack enclosure 116. In some embodiments, a separate transport device, external of the rack enclosure 116, is not required to transport the die carriers 108 to a separate sorting system, removed from the rack enclosure 116.

As illustrated in FIG. 2, some embodiments of the first sorter 212 comprise a first guide 220 and a second guide 222 provided adjacent to the first sorter load port 216. In some embodiments, the first guide 220 and the second guide 222 cooperate with portions of die carriers 108 delivered to the first sorter 212 by the transport system 120 to maintain the die carriers 108 in defined positions relative to the first sorter 212. For example, in some embodiments, cooperation between the first guide 220 and a first tray cassette 300, and between the second guide 222 and a second tray cassette 300 maintains orientations of the first tray cassette 300 and the second tray cassette 300 relative to the first sorter 212 to enable a conveyor 224 of the first sorter 212 to transfer one or more semiconductor dies between the tray cassettes 300 delivered to the first sorter 212.

Similar to the first sorter 212, in some embodiments, the second sorter 214 comprises a third guide 226 and a fourth guide 228 provided adjacent to the second sorter load port 218. In some embodiments, the third guide 226 and the fourth guide 228 cooperate with portions of die carriers 108 delivered to the second sorter 214 by the transport system 120 via the second sorter load port 218 to maintain the die carriers 108 in defined positions relative to the second sorter 214. For example, in some embodiments, cooperation between the third guide 226 and a first boat magazine 500 and between the fourth guide 228 and a second boat magazine 500 maintains orientations of the first boat magazine 500 and the second boat magazine 500 relative to the second sorter 214 to enable a conveyor 230 to transfer one or more semiconductor dies between the boat magazines 500 delivered to the second sorter 214.

According to some embodiments, the first guide 220, second guide 222, third guide 226, and fourth guide 228 each comprise an interface that cooperates with a base of the die carriers 108 to establish a position of the die carriers suitable for the transfer of one or more semiconductor dies as described below. Some embodiments of the first guide 220 and the second guide 222 comprise the same interface, configuring the first guide 220 and the second guide 222 specifically for receiving the same die carriers 108, such as tray cassettes 300 or boat magazines 500. Some embodiments of the third guide 226 and the fourth guide 228 comprise the same interface, configuring the third guide 226 and the fourth guide 228 specifically for receiving the same die carriers 108, such as tray cassettes 300 or boat magazines 500. In some embodiments, the interface of the first guide 220 and the second guide 222 is different than interfaces of the third guide 226 and the fourth guide 228.

In some embodiments, the interface of at least one of the first guide 220, second guide 222, third guide 226, or fourth guide 228 comprises a kinematic coupling interface 902. For example, FIG. 9A illustrates a perspective view of an embodiment of a guide 900 representing the first guide 220 and the second guide 222, comprising a kinematic coupling interface 902, in accordance with some embodiments. In some embodiments, the guide 900 comprises a plate 912 on which the die carriers 108 are to rest and a kinematic coupling interface 902. The kinematic coupling interface 902 comprises a plurality of locator pins, such as a first locator pin 904, a second locator pin 906, and a third locator pin 908 that protrude outwardly in an upward direction from a top surface 910 of the plate 912.

For example, embodiments of the first locator pin 904 comprise a cylindrical base region 914 that protrudes upward, from the top surface 910, and a conical region 916 extending upward from the cylindrical base region 914. The conical region 916 forms an apex 918 to give the first locator pin 904 a cross section having form an inverted V-shape. The second locator pin 906 and the third locator pin 908 of the present embodiment have a similar physical configuration. For example, the second locator pin 906 and the third locator pin 908 comprise a cylindrical base region 920 that protrudes upward, from the top surface 910, and a conical region 922 extending upward from the cylindrical base region 920. The conical region 922 forms an apex 924 that gives the second locator pin 906 and the third locator pin 908 a cross section having form an inverted V-shape. However, the first locator pin 904, the second locator pin 906, and the third locator pin 908 may have different physical configurations and shapes without departing from the scope of the present disclosure.

Figure 6:
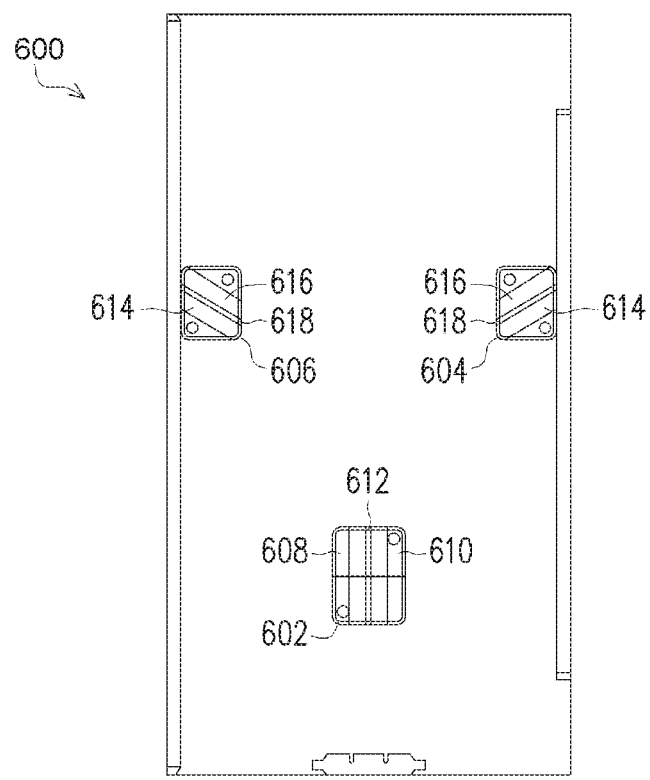
FIG. 6 is a bottom view of a boat magazine comprising a kinematic coupling base that cooperates with a kinematic coupling interface of a guide that maintains the boat magazine in a position while coupled to a sorter, in accordance with some embodiments.
Figure 9B:
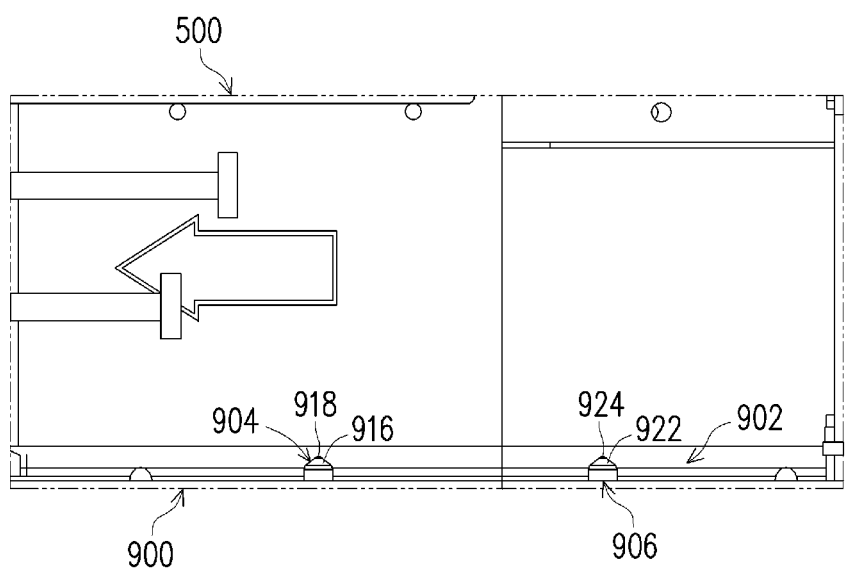
FIG. 9B is a side view of a kinematic coupling interface cooperating with a boat magazine supported by a guide, in accordance with some embodiments.
Figure 10A:
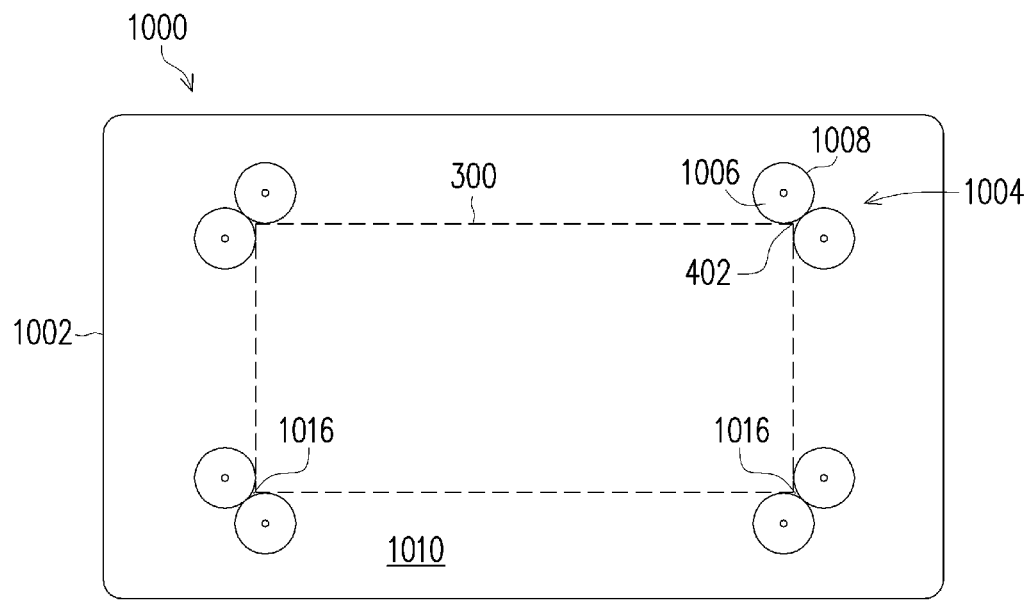
FIG. 10A is a top view of a guide for a sorter, the guide comprising a cone guide pin interface, in accordance with some embodiments.

As shown in FIG. 9B, for example, the kinematic coupling interface 902 cooperates with a kinematic coupling base 600, illustrated in FIG. 6, of a die carrier 108 to establish a defined position of the die carrier 108 relative to the sorter to which the kinematic coupling interface 902 is provided. FIG. 6 illustrates an exemplary bottom view of an embodiment of the boat magazine 500 comprising a kinematic coupling base 600 that cooperates with the kinematic coupling interface 902. In some embodiments, the kinematic coupling base 600 comprises a first recess 602, a second recess 604, and a third recess 606.

An example of the first recess 602 comprises two inward-projecting, angled surfaces 608, 610, that extend in an upward direction, toward an interior of the boat magazine 500, forming a peak 612 where the angled surfaces 608, 610 intersect. Some embodiments of the peak 612 extend longitudinally in a direction parallel with a longitudinal axis, or a longest axis, of the boat magazine 500. Embodiments of the second recess 604 and the third recess 606 each comprise inward-projecting, angled surfaces 614, 616, that extend in an upward direction, toward an interior of the boat magazine 500 forming a peak 618 where the angled surfaces 614, 616 intersect. The peaks 618 extend in directions that are not parallel with the longitudinal axis of the boat magazine 500. For example, the peaks 618 are oriented at an angle of between fifteen) (15°) degrees and seventy five (75°) degrees relative to the longitudinal axis of the boat magazine 500.

In some embodiments, the dimensions and orientations of the first locator pin 904, the second locator pin 906, and the third locator pin 908 are complementary to the dimensions and orientations of the first recess 602, the second recess 604, and the third recess 606, respectively. Cooperation between the kinematic coupling interface 902 and the kinematic coupling base 600 constrains the boat magazine 500 in place on the guide 900, relative to the corresponding sorter, providing precision and certainty of location of the boat magazine 500 installed on the sorter. For example, as shown in FIG. 9B, the first recess 602 receives a portion of the conical region 916 of the first locator pin 904. The second recess 604 receives a portion of the conical region 922 of the second locator pin 906, and the third recess 606 receives a portion of the conical region 922 of the third locator pin 908 (not shown in FIG. 9B). Cooperation between the inverted V-shape of the locator pins 904, 906, 908 and the angled surfaces 608, 610, 614, 616 of the respective recesses 602, 604, 606 restricts at least two degrees of freedom of movement of the boat magazine 500 relative to the sorter, establishing a defined position of the boat magazine 500 on the sorter for transfer of the semiconductor die(s).

Figure 10B:
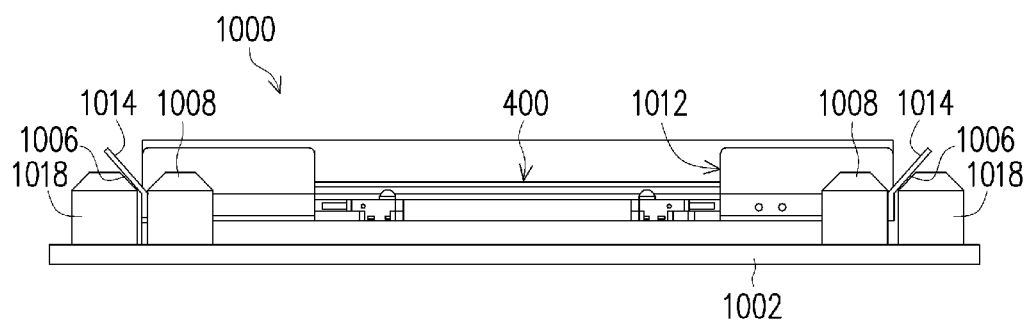
FIG. 10B is a side view of a base of a die carrier positioned for a transfer of die carriers by a cone guide pin interface, in accordance with some embodiments.

According to some embodiments, the interface of at least one of the first guide 220, second guide 222, third guide 226, or fourth guide 228 comprises a cone-guide interface 1004 (FIGS. 10 A and 10B). For example, FIG. 10A illustrates a top view of a guide 1000 representing the third guide 226 and the fourth guide 228, in accordance with some embodiments. In some embodiments, the guide 1000 comprises a plate 1002 on which die carriers such as the tray cassette 300 (represented by broken lines in FIG. 10A, the base 400 of which is shown in FIG. 10B) are to rest, and a cone guide interface 1004. In some embodiments, the cone guide interface 1004 comprises a set of tapered surfaces 1006 that, when contacted by the base 400 of the tray cassette 300, urge the tray cassette 300 into a desired location on the guide 1000 to establish a defined position of the tray cassette 300 relative to the corresponding sorter.

Figure 4:
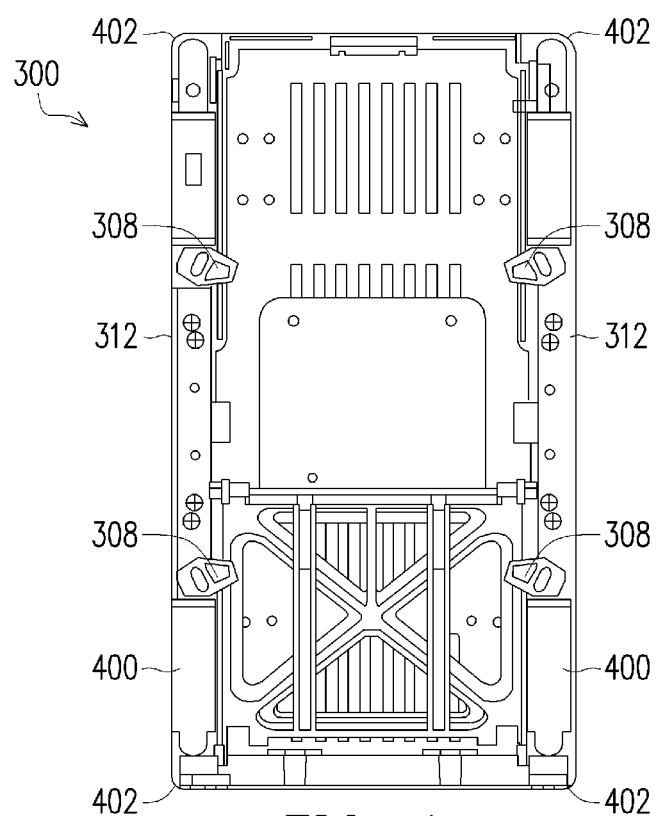
FIG. 4 is a bottom view of a tray cassette comprising a base that cooperates with a set of tapered surfaces of a guide that maintains the tray cassette in a position while coupled to a sorter, in accordance with some embodiments.

According to some embodiments, the tray cassette 300 comprises a base 400 with a physical configuration that is different from the kinematic coupling base 600 described above. For example, FIG. 4 illustrates a bottom view of the tray cassette 300 illustrated in FIG. 3, in accordance with some embodiments. The base 400 of the tray cassette 300 is formed adjacent to a bottom of the side surfaces 312. In some embodiments, the base 400 does not comprise the first recess 602, second recess 604, or third recess 606 of the kinematic coupling base 600. Instead, in some embodiments, the base 400 is a rectangular base with four corners 402 defining a rectangular footprint.

According to some embodiments, the base 400 comprises a plurality of brackets 1012. Each of the brackets 1012 comprises an angled portion 1014 that protrudes outwardly, generally away from an interior of the tray cassette 300. The brackets 1012 are arranged along sides of the base 400 adjacent to the corners 1016 (FIG. 10A). For example, the angled portions 1014 provided to a given corner 1016 extend along regions of the base 400 to form a right angle at the given corner 1016.

For the embodiment of the guide 1000 illustrated in FIG. 10B, the tapered surfaces 1006 are formed as conical projections 1008 that protrude upwardly from cylindrical regions 1018 that extend upwardly, away from a top surface 1010 of the plate 1002. A plurality of conical projections 1008 are arranged to engage the angled portions 1014 of the brackets 1012 provided to the four corners 402 of the base 400 when the tray cassette 300 is properly positioned. The conical projections 1008 of some embodiments are arranged to cooperate with a plurality of corners 1016 of the die carrier 108, as shown in FIG. 10A, or arranged to cooperate with the angled portions 1014 of the brackets 1012 as shown in FIG. 10B. Portions of the die carrier 108 (e.g., corners 1016 or angled portions 1014 of the brackets 1012) slide along the tapered surfaces 1006 as the die carrier 108 is lowered into place onto the guide 1000, thereby establishing a defined position of the die carrier 108 on the guide 1000 for the transfer of the semiconductor die(s) as described below. Cooperation between the portions of the die carrier 108 and the tapered surfaces 1006 of the conical projections 1008 arranged about opposite surfaces of the die carrier 108 predictably position the die carrier 108 on the guide 1000.

According to some embodiments, the conveyor 224 of the first sorter 212 comprises a shuttle 232 that, while at position A in FIG. 2, retrieves one or more semiconductor dies from a donor tray cassette 300 installed at a defined location relative to the sorter by the first guide 220. In some embodiments, once the one or more semiconductor dies have been retrieved from the donor tray cassette 300, the shuttle 232 travels along a shuttle rail 234 from position A, to position B, and on to position C through operation of a stepper motor or other actuator, for example.

In some embodiments, at position C, the shuttle 232 is arranged adjacent to a recipient tray cassette 300 installed on the second guide 222. In some embodiments, the second guide 222 maintains the recipient tray cassette 300 in an orientation suitable for receiving the one or more semiconductor dies being transferred from the donor tray cassette 300 installed on the first guide 220. In some embodiments, the shuttle 232 delivers the one or more semiconductor dies retrieved from the donor tray cassette 300 to the recipient tray cassette 300.

In some embodiments, the second sorter 214 is similar in construction and operation to the first sorter 212. In some embodiments, the conveyor 230 comprises a shuttle 236 that, while at position X in FIG. 2, retrieves one or more semiconductor dies from a donor boat magazine 500 installed on the third guide 226. In some embodiments, once the one or more semiconductor dies have been retrieved from the donor boat magazine 500, the shuttle 236 travels along a shuttle rail 238 from position X, to position Y, and on to position Z through operation of a stepper motor or other actuator, for example.

In some embodiments, at position C, the shuttle 236 is arranged adjacent to a recipient boat magazine 500 installed on the fourth guide 228. The fourth guide 228 maintains the recipient boat magazine 500 in an orientation suitable for receiving the one or more semiconductor dies being transferred from the donor boat magazine 500 installed on the third guide 226. In some embodiments, the shuttle 236 delivers the one or more semiconductor dies retrieved from the donor boat magazine 500 to the recipient boat magazine 500.

According to some embodiments, a single semiconductor die is transferred between die carriers 108. For other embodiments, however, a plurality of semiconductor dies are transferred in one transfer operation. For example, FIG. 7 illustrates a top view of a tray 700 that supports a plurality of semiconductor dies 702, in accordance with some embodiments. In some embodiments, the tray cassette 300 stores a plurality of the trays 700 stacked on top of each other as described above, and a protective cover 704 is provided to protect the semiconductor dies 702 against physical damage and debris. In some embodiments, the protective cover 704 is removed to reveal one or more of the semiconductor dies 702, such as the semiconductor die 702 arranged in the top left corner of the tray 700 illustrated in FIG. 7, for example. In some embodiments, the tray 700 comprises a frame 706 that defines a plurality of receptacles 708 that separately support a plurality of the semiconductor dies 702.

According to some embodiments, the trays 700 are labeled with a computer-readable code. A two-dimensional barcode 710 is illustrated in FIG. 7 as an example of a computer-readable code, but the present disclosure is not so limited. Other computer-readable codes, such as radio-frequency identification ("RFID") tags and other such data storage technology, are also included within the scope of the present disclosure. For the sake of brevity and clarity, however, the barcode 710 is illustrated and described for illustrative purposes.

Some embodiments of the barcode 710 store or reference information relating to the semiconductor dies 702 carried by the tray 700. For example, the barcode 710 stores or references information identifying progress made in the fabrication process, one or more previous processes that has/have already been completed, one or more future processes to be completed, a serial number, a lot number, a type of circuit being fabricated, an application in which the semiconductor dies are to be installed, a customer, any other information pertinent to the fabrication process, or any combination thereof.

FIG. 8 illustrates a top view of a boat 800 that comprises a frame 804 defining a plurality of receptacles 806 that separately support different semiconductor dies 808, in accordance with some embodiments. In some embodiments, because the boats 800 are individually supported in the apertures 502 of the boat magazine 500, instead of resting on an underlying boat, the semiconductor dies 808 are not covered by a protective cover.

According to some embodiments, the boats 800 are labeled with a computer-readable code, similar to the trays 700 discussed above. A barcode 810, such as a two-dimensional barcode 810 for example, is illustrated in FIG. 8 as an example of a computer-readable code, but again the present disclosure is not so limited. Other computer-readable codes such as RFID tags and other such data storage technology are also included within the scope of the present disclosure. For the sake of brevity and clarity, however, the barcode 810 is illustrated and described for illustrative purposes.

Similar to the barcode 710 described above, some embodiments of the barcode 810 store or reference information relating to the semiconductor dies 808 carried by the boat 800. For example, the barcode 810 stores or references information identifying progress made in the fabrication process, a location of the corresponding semiconductor die(s) following the transfer between die carriers 108, one or more previous processes that has/have already been completed, one or more future processes to be completed, a serial number, a lot number, a type of circuit being fabricated, an application in which the semiconductor dies are to be installed, a customer, any other information pertinent to the fabrication process, or any combination thereof.

Referring once again to FIG. 1, some embodiments of the sorting system 126 comprise a scanner 132. In some embodiments, the scanner 132 is operable to interrogate a computer-readable code accompanying the semiconductor dies being transferred as described herein. For example, in some embodiments to interrogate a RFID tag, the scanner 132 comprises a signal generator that generates an excitation signal to energize an antenna provided to the RFID tag. In some embodiments, the scanner 132 comprises a receiver that detects a wireless signal emitted by the antenna of the RFID tag in response to being energized by the excitation signal.

According to some embodiments, the scanner 132 is configured as a barcode reader, as illustrated in FIG. 1. In some embodiments, the barcode reader comprises an optical image capture device 134 such as a complementary metal oxide semiconductor (CMOS) or charge-coupled device (CCD) sensor, for example. In some embodiments, the optical image capture device 134 optically captures an image of a barcode, such as the barcode 710 or the barcode 810, during a process of transferring semiconductor dies between die carriers 108.

In some embodiments, responsive to interrogating the computer-readable code, the scanner 132 transmits a signal to control circuitry 136 in communication with the scanner 132. In some embodiments, the control circuitry 136 modifies a record maintained in a database 138 as a result of the computer-readable code being interrogated by the scanner 132. In some embodiments, the modified record indicates that the corresponding semiconductor die has been transferred between the die carriers 108 or other status pertaining to the fabrication process.

In some embodiments, the transport system 120 returns the donor tray cassette 300 to one of the first storage cells 206 or the second storage cells 208 after the one or more semiconductor dies have been retrieved from the donor tray cassette 300. In some embodiments, the transport system 120 returns the recipient tray cassette 300 to one of the first storage cells 206 or the second storage cells 208 after the one or more semiconductor dies have been delivered to the recipient tray cassette 300. In some embodiments, from the first or second storage cells 206, 208, the transport system 120 is controlled to return the recipient tray cassette 300 to the load port 204, from where the overhead hoist transfer system 102 receives and transports the recipient tray cassette 300 to a subsequent processing location.

In some embodiments, the transport system 120 returns the donor boat magazine 500 to one of the first storage cells 206 or the second storage cells 208 after the one or more semiconductor dies have been retrieved from the donor boat magazine 500. In some embodiments, the transport system 120 returns the recipient boat magazine 500 to one of the first storage cells 206 or the second storage cells 208 after the one or more semiconductor dies have been delivered to the recipient boat magazine 500. In some embodiments, from the first or second storage cells 206, 208, the transport system 120 is controlled to return the recipient boat magazine 500 to the load port 204, from where the overhead hoist transfer system 102 receives and transports the recipient boat magazine 500 to a subsequent processing location.

Figure 11:
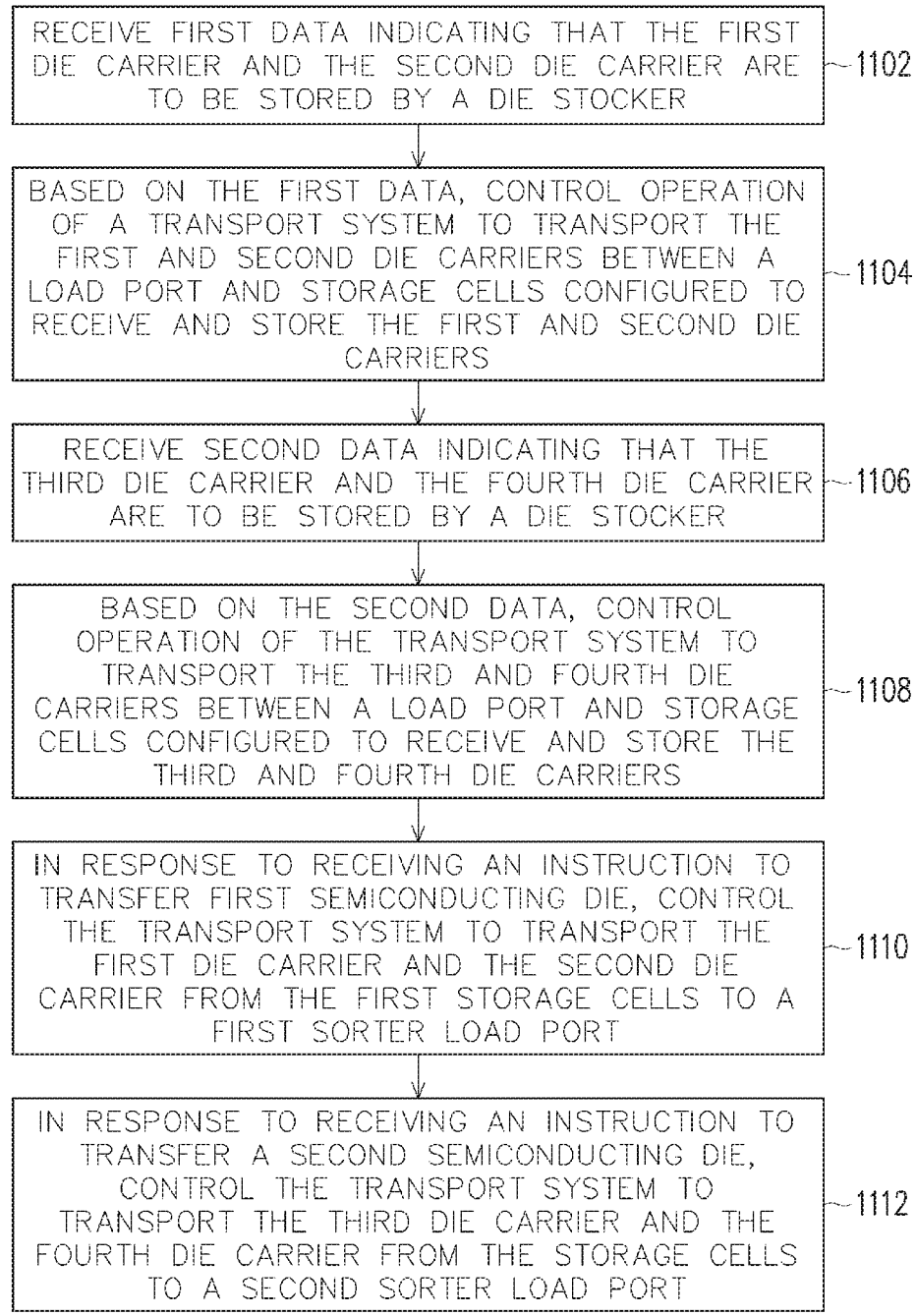
FIG. 11 is a flow diagram schematically depicting a method of controlling a transfer of a semiconductor die between die carriers, in accordance with some embodiments.

A method of storing and transferring semiconductor dies between die carriers in accordance with some embodiments is schematically depicted in the flow diagram of FIG. 11. In some embodiments, first data indicating that a first die carrier 108 and the second die carrier 108 are to be stored by a die stocker 100 is received at 1102. In some embodiments, the first data is received over a communication network connecting the control circuitry 136 to a remote terminal. According to some embodiments, the first data is received as part of an automatic transmission in response to the occurrence of an event during the fabrication process. For example, delivery of the first and second die carriers 108 by the overhead hoist transfer system 102 causes the first data to be received according to some embodiments. In some embodiments, the first data identifies the first and second die carriers 108 to allow the control circuitry to determine whether to transport the first and second die carriers 108 to the first or second storage cells 206, 208 according to some embodiments.

In some embodiments, based on the first data that is received, the control circuitry 136 controls operation of the transport system 120, at 1104 in FIG. 11, to transport the first die carrier 108 and the second die carrier 108 between a load port 204 through which the first die carrier 108 and the second die carrier 108 are introduced to the die stocker 100, and first storage cells 206 of the die stocker 100. For example, based upon the first data, the control circuitry 136 may determine that the first and second die carriers 108 are tray cassettes 300, and are thus to be transported and stored in the first storage cells 206, which are configured for receiving and storing tray cassettes 300. The process is described from this point forward with the understanding that the first and second die carriers are tray cassettes 300.

In some embodiments, second data, indicating that a third die carrier 108 and the fourth die carrier 108 are to be stored by the die stocker 100, is received by the control circuitry 136 at 1106. According to some embodiments, the third and fourth die carriers 108 are boat magazines 500, which have a different physical configuration than the tray cassettes 300 transported and stored in the first storage cells 206. The process is described from this point forward with the understanding that the third and fourth die carriers 108 are boat magazines 500.

In some embodiments, based on the second data, operation of the transport system 120 is controlled, at 1108, to transport the boat magazines 500 between the load port 204 through which the boat magazines 500 were introduced to the die stocker 100, and second storage cells 208 of the die stocker 100 configured to receive and store the boat magazines 500. According to some embodiments, the first storage cells 206 that receive and store the tray cassettes 300 are incompatible with the boat magazines 500.

In some embodiments, an instruction is subsequently received by the control circuitry 136, indicating that a first semiconductor die, or a tray of semiconductor dies, is to be transferred from one of the tray cassettes 300 to another tray cassette 300. In some embodiments, in response to receiving such an instruction, the transport system 120 is controlled by the control circuitry 136, at 1110, to transport the tray cassettes 300 involved from the first storage cells 206 to a first sorter load port 216 of the die stocker 100 through which the tray cassettes are delivered to the first sorter 212 that is to transfer the first semiconductor die or the tray of semiconductor dies between the tray cassettes 300. In some embodiments, the tray cassettes 300 are introduced by the transport system 120 to the first and second guides 220, 222 of the first sorter 212. In some embodiments, the bases 400 of the tray cassettes 300 engage the interfaces of the first and second guides 220, 222.

In some embodiments, another instruction is received by the control circuitry 136, indicating that a second semiconductor die, or a boat of semiconductor dies is to be transferred from one of the boat magazines 500 to another boat magazine 500. In some embodiments, in response to receiving such an instruction, the transport system 120 is controlled by the control circuitry 136, at 1112, to transport the boat magazines 500 involved from the second storage cells 208 to a second sorter load port 218 of the die stocker 100, through which the boat magazines 500 are delivered to the second sorter 214 that is to transfer the second semiconductor die or the boat of semiconductor dies between the boat magazines 500. In some embodiments the boat magazines 500 are introduced by the transport system 120 to the third and fourth guides 226, 228 of the second sorter 214, and the kinematic coupling bases 600 of the boat magazines 500 engage the interfaces of the third and fourth guides 226, 228.

Figure 12:
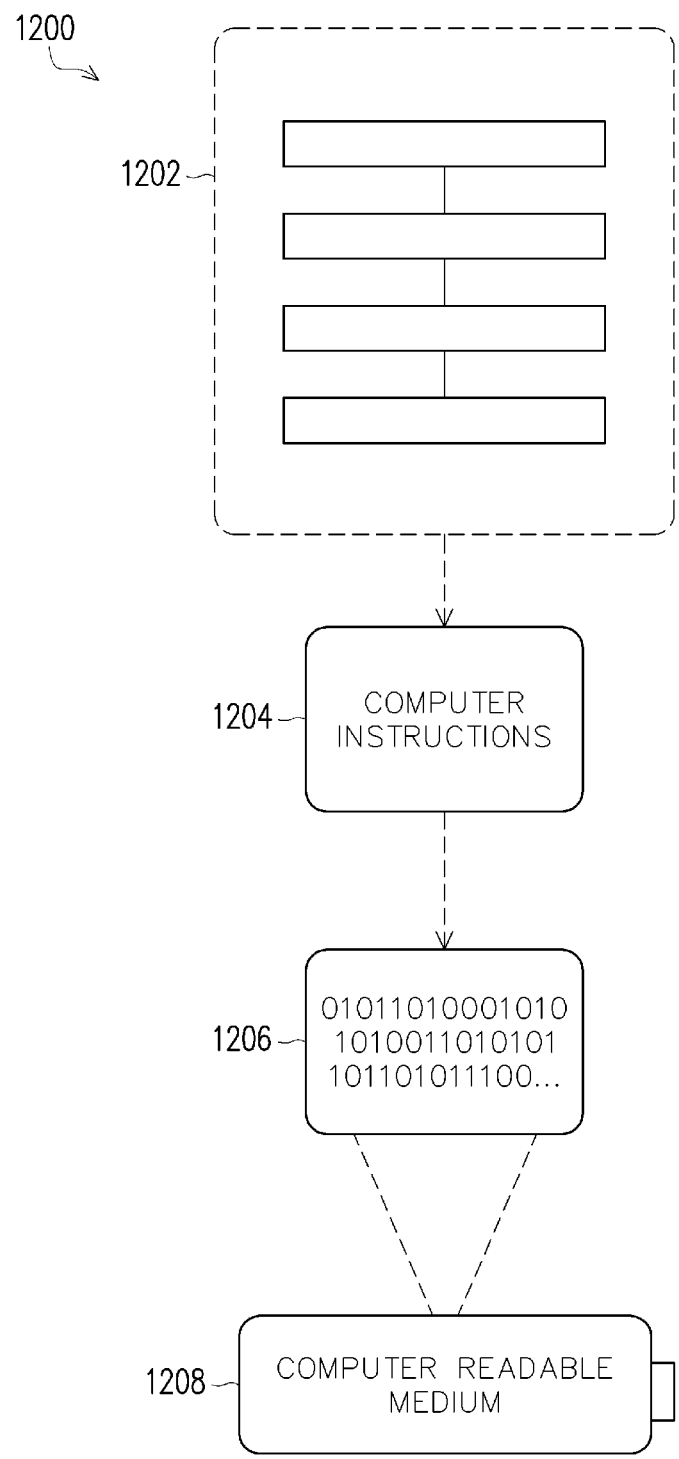
FIG. 12 illustrates an example computer-readable medium wherein processor-executable instructions configured to embody one or more of the provisions set forth herein may be comprised, according to some embodiments.

Still another embodiment involves a computer-readable medium comprising processor-executable instructions configured to implement one or more of the techniques presented herein. An exemplary computer-readable medium is illustrated in FIG. 12, wherein the embodiment 1200 comprises a computer-readable medium 1208 (e.g., a CD-R, DVD-R, flash drive, a platter of a hard disk drive, etc.), on which is encoded computer-readable data 1206. This computer-readable data 1206 in turn comprises a set of processor-executable computer instructions 1204 configured to operate according to one or more of the principles set forth herein. In some embodiments 1200, the processor-executable computer instructions 1204 are configured to perform a method 1202, such as at least some of the aforementioned described methods. In some embodiments, the processor-executable computer instructions 1204 are configured to implement a system, such as at least some of the aforementioned systems. Many such computer-readable media may be devised by those of ordinary skill in the art that are configured to operate in accordance with the techniques presented herein.

Figure 13:
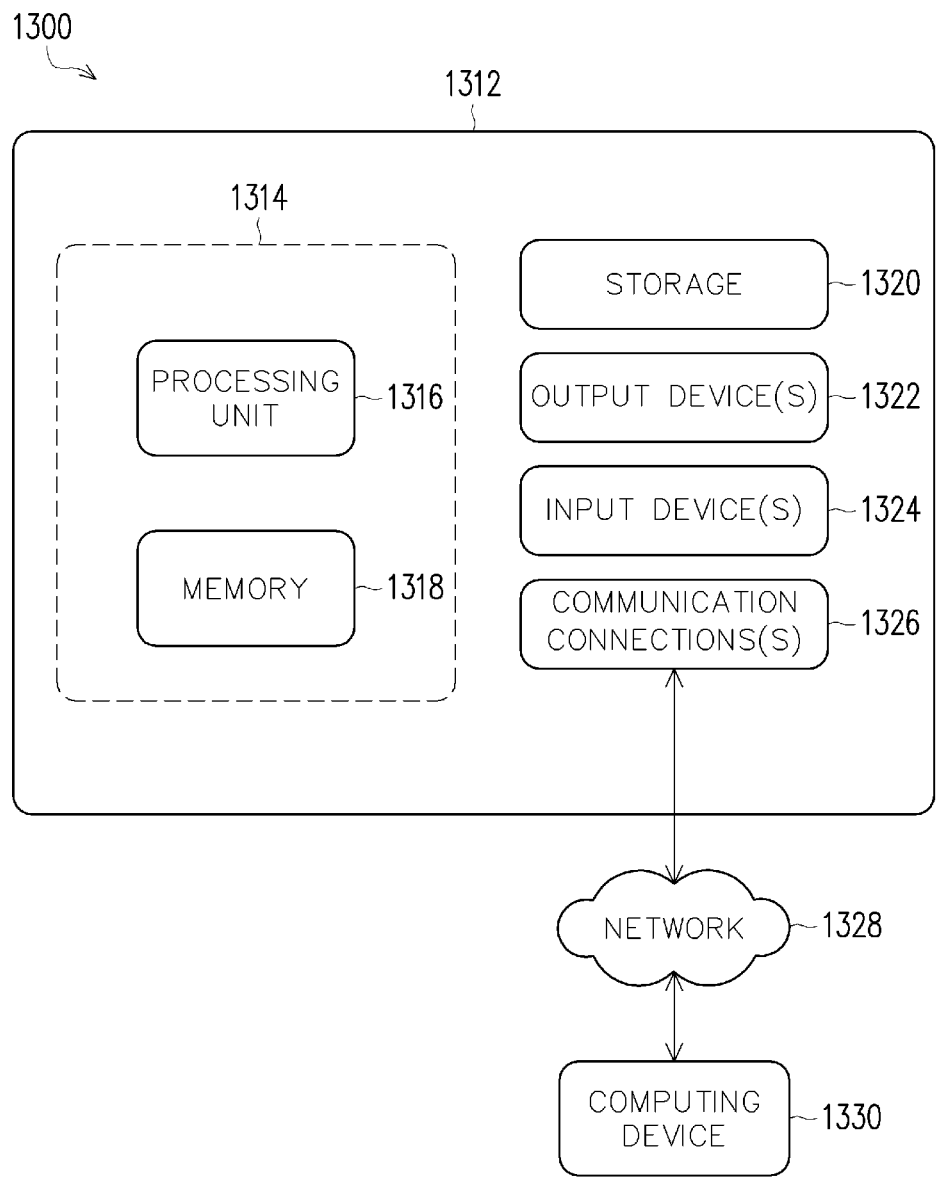
FIG. 13 illustrates an example computing environment wherein one or more of the provisions set forth herein may be implemented, according to some embodiments.

FIG. 13 and the following discussion provide a brief, general description of a suitable computing environment to implement embodiments of one or more of the provisions set forth herein. The operating environment of FIG. 13 is only one example of a suitable operating environment and is not intended to suggest any limitation as to the scope of use or functionality of the operating environment. Example computing devices include, but are not limited to, personal computers, server computers, hand-held or laptop devices, mobile devices (such as mobile phones, Personal Digital Assistants (PDAs), media players, and the like), multiprocessor systems, consumer electronics, mini computers, mainframe computers, distributed computing environments that include any of the above systems or devices, and the like.

Although not required, embodiments are described in the general context of "computer readable instructions" being executed by one or more computing devices. Computer readable instructions may be distributed via computer readable media (discussed below). Computer readable instructions may be implemented as program modules, such as functions, objects, Application Programming Interfaces (APIs), data structures, and the like, that perform particular tasks or implement particular abstract data types. Typically, the functionality of the computer readable instructions may be combined or distributed as desired in various environments.

FIG. 13 depicts an example of a system 1300 comprising a computing device 1312 configured to implement some embodiments provided herein. In some configurations, computing device 1312 includes at least one processing unit 1316 and memory 1318. Depending on the exact configuration and type of computing device, memory 1318 may be volatile (such as RAM, for example), non-volatile (such as ROM, flash memory, etc., for example) or some combination of the two. This configuration is illustrated in FIG. 13 by dashed line 1314.

In some embodiments, computing device 1312 may include additional features and/or functionality. For example, computing device 1312 may also include additional storage (e.g., removable and/or non-removable) including, but not limited to, magnetic storage, optical storage, and the like. Such additional storage is illustrated in FIG. 13 by storage 1320. In some embodiments, computer readable instructions to implement one or more embodiments provided herein may be in storage 1320. Storage 1320 may also store other computer readable instructions to implement an operating system, an application program, and the like. Computer readable instructions may be loaded in memory 1318 for execution by processing unit 1316, for example.

The term "computer readable media" as used herein includes computer storage media. Computer storage media includes volatile and nonvolatile, removable and non-removable media implemented in any method or technology for storage of information such as computer readable instructions or other data. Memory 1318 and storage 1320 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by computing device 1312. Any such computer storage media may be part of computing device 1312.

Computing device 1312 may also include communication connection(s) 1326 that allows computing device 1312 to communicate with other devices. Communication connection(s) 1326 may include, but is not limited to, a modem, a Network Interface Card (NIC), an integrated network interface, a radio frequency transmitter/receiver, an infrared port, a USB connection, or other interfaces for connecting computing device 1312 to other computing devices. Communication connection(s) 1326 may include a wired connection or a wireless connection. Communication connection(s) 1326 may transmit and/or receive communication media.

The term "computer readable media" may include communication media. Communication media typically embodies computer readable instructions or other data in a "modulated data signal" such as a carrier wave or other transport mechanism and includes any information delivery media. The term "modulated data signal" may include a signal that has one or more of its characteristics set or changed in such a manner as to encode information in the signal.

Computing device 1312 may include input device(s) 1324 such as keyboard, mouse, pen, voice input device, touch input device, infrared cameras, video input devices, and/or any other input device. Output device(s) 1322 such as one or more displays, speakers, printers, and/or any other output device may also be included in computing device 1312. Input device(s) 1324 and output device(s) 1322 may be connected to computing device 1312 via a wired connection, wireless connection, or any combination thereof. In some embodiments, an input device or an output device from another computing device may be used as input device(s) 1324 or output device(s) 1322 for computing device 1312.

Components of computing device 1312 may be connected by various interconnects, such as a bus. Such interconnects may include a Peripheral Component Interconnect (PCI), such as PCI Express, a Universal Serial Bus (USB), firewire (IEEE 1394), an optical bus structure, and the like. In some embodiments, components of computing device 1312 may be interconnected by a network. For example, memory 1318 may be comprised of multiple physical memory units located in different physical locations interconnected by a network.

Those skilled in the art will realize that storage devices utilized to store computer readable instructions may be distributed across a network. For example, a computing device 1330 accessible via a network 1328 may store computer readable instructions to implement one or more embodiments provided herein. Computing device 1312 may access computing device 1330 and download a part or all of the computer readable instructions for execution. Alternatively, computing device 1312 may download pieces of the computer readable instructions, as needed, or some instructions may be executed at computing device 1312 and some at computing device 1330.

In some embodiments, integrating the first sorter 212 and the second sorter 214 into the rack enclosure 116 allows a die transfer functionality to be performed at the rack enclosure 116, without transporting the die carriers 108 involved in the die transfer to an external sorting system. In some embodiments, the transport system 120 that transports the die carriers 108 between the load port 204 and the first storage cells 206 and the second storage cells 208 also conveys the die carriers 108 between the first storage cells 206 and the second storage cells 208 and the first sorter 212 and the second sorter 214. In some embodiments, as a result, die carriers 108 having different configurations are able to be stored and delivered to the first sorter 212 and the second sorter 214. In some embodiments, the die carriers 108 also remain within the controlled environment of the rack enclosure 116, thereby avoiding possible exposure to outside contaminants. In some embodiments, the die carriers 108 are transferred between the load port 204, the first and second storage cells 206, 208, and the first and second sorters 212, 214 by a common transport system 120, eliminating the need for a separate conveyor system to deliver the die carriers 108 from the rack enclosure 116 to a separate, stand-alone sorter external of the rack system.

According to some embodiments, a die stocker is provided. The die stocker includes a rack enclosure including a first plurality of storage cells configured to receive and store a first die carrier and a second die carrier having a first physical configuration. The rack enclosure also includes a second plurality of storage cells configured to receive and store a third die carrier and a fourth die carrier having a second physical configuration. The first physical configuration of the first die carrier and the second die carrier is different from the second physical configuration of the third die carrier and the fourth die carrier. The rack enclosure also includes a load port through which the first die carrier, the second die carrier, the third die carrier and the fourth die carrier are introduced to an interior of the rack enclosure. The rack enclosure also includes a transport system for transporting the first die carrier and the second die carrier between the load port and the first plurality of storage cells within the rack enclosure, and for transporting the third die carrier and the fourth die carrier between the load port and the second plurality of storage cells within the rack enclosure. The die stocker also includes a sorting system including a first sorter that receives the first die carrier and the second die carrier from the transport system of the rack enclosure and transfers a first semiconductor die between the first die carrier and the second die carrier. The sorting system also includes a second sorter that receives the third die carrier and the fourth die carrier from the transport system of the rack enclosure and transfers a second semiconductor die between the third die carrier and the fourth die carrier.

According to some embodiments, a method of storing a first die carrier and a second die carrier having a first physical configuration, and a third die carrier and a fourth die carrier having a second physical configuration that is different from the first physical configuration is provided. The method includes receiving first data indicating that the first die carrier and the second die carrier are to be stored by a die stocker. The method also includes based on the first data, controlling operation of a transport system to transport the first die carrier and the second die carrier between a load port through which the first die carrier and the second die carrier are introduced to a rack enclosure of the die stocker, and first storage cells of the rack enclosure configured to receive and store the first die carrier and the second die carrier. The method also includes receiving second data indicating that the third die carrier and the fourth die carrier are to be stored by the die stocker and, based on the second data, controlling operation of the transport system to transport the third die carrier and the fourth die carrier between the load port through which the third die carrier and the fourth die carrier are introduced to the rack enclosure, and second storage cells of the die stocker configured to receive and store the third die carrier and the fourth die carrier. The method also includes in response to receiving an instruction to transfer a first semiconductor die from the first die carrier to the second die carrier, controlling the transport system to transport the first die carrier and the second die carrier from the first storage cells to a first sorter load port of the rack enclosure through which the first die carrier and the second die carrier are delivered to a first sorter that transfers the first semiconductor die between the first die carrier and the second die carrier. The method also includes in response to receiving an instruction to transfer a second semiconductor die from the third die carrier to the fourth die carrier, controlling the transport system to transport the third die carrier and the fourth die carrier from the second storage cells to a second sorter load port of the rack enclosure through which the third die carrier and the fourth die carrier are delivered to a second sorter that transfers the second semiconductor die between the third die carrier and the fourth die carrier.

According to some embodiments, a semiconductor die fabrication system is provided. The semiconductor die fabrication system includes tray cassettes that store a first tray and a second tray, the second tray being stacked on top of, and supported by the first tray within the tray cassettes. The semiconductor die fabrication system also includes boat magazines that store a first boat and a second boat, the first boat being supported by a first flange within the boat magazines, and the second boat being supported by a second flange within the boat magazines, vertically above and spaced apart from the first boat within the boat magazines. The semiconductor die fabrication system also includes a rack enclosure includes a plurality of storage cells that receive and store the tray cassettes and the boat magazines, a load port through which the tray cassettes and the boat magazines are introduced to an interior of the rack enclosure, and a transport system for transporting the tray cassettes and the boat magazines within the rack enclosure between the load port and the storage cells. The semiconductor die fabrication system also includes an overhead hoist transfer system that delivers the tray cassettes and the boat magazines to the load port of the rack enclosure and a first sorter that receives the tray cassettes, and transfers the first tray or the second tray between the tray cassettes. The semiconductor die fabrication system also includes a second sorter that receives the boat magazines, and transfers the first boat or the second boat between the boat magazines.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc., depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor die fabrication system comprising:
    tray cassettes that store a first tray and a second tray, the second tray being stacked on top of, and supported by the first tray within the tray cassettes;
    boat magazines that store a first boat and a second boat, the first boat being supported by a first flange within the boat magazines, and the second boat being supported by a second flange within the boat magazines, vertically above and spaced apart from the first boat within the boat magazines;
    a rack enclosure comprising:
        a first plurality of storage cells configured to receive and store the tray cassettes,
        a second plurality of storage cells configured to receive and store the boat magazines,
        a load port through which the tray cassettes and the boat magazines are introduced to an interior of the rack enclosure;
        an overhead hoist transfer system that delivers the tray cassettes and the boat magazines to the load port of the rack enclosure;
        a transport system for transporting the tray cassettes between the load port and the first plurality of storage cells within the rack enclosure, and for transporting the boat magazines between the load port and the second plurality of storage cells within the rack enclosure; and
    a sorting system comprising:
        a first sorter that receives the tray cassettes from the transport system of the rack enclosure and transfers the first tray or the second tray between the tray cassettes wherein the first sorter comprises:
            a shuttle configured to retrieve at least one of the first tray or the second tray from a donor tray cassette of the tray cassettes installed on a first guide, and
            a shuttle rail configured to move the shuttle from a first location proximate the first guide to a second location proximate a second guide having installed thereon a recipient tray cassette of the tray cassettes, wherein the shuttle is configured to deliver the at least one of the first tray or the second tray to the recipient tray cassette, and
        a second sorter that receives the boat magazines from the transport system of the rack enclosure and transfers the first boat or the second boat between the boat magazines.

2. The semiconductor die fabrication system of claim 1, wherein the first plurality of storage cells are incompatible with the boat magazines, preventing the first plurality of storage cells from receiving and storing the boat magazines.

3. The semiconductor die fabrication system claim 1, wherein the load port comprises a first load port guide for maintaining at least one of the tray cassettes at a first defined position relative to a frame of the load port defining an aperture.

4. The semiconductor die fabrication system of claim 3, wherein:
    the load port comprises a second load port guide for maintaining at least one of the boat magazines at a second defined position relative to the frame of the load port defining the aperture, and
    the first load port guide has a different configuration than the second load port guide.

5. The semiconductor die fabrication system of claim 1, wherein the load port comprises a shelf on which at least one of the tray cassettes or at least one of the boat magazines is deposited by the overhead hoist transfer system for introduction into the interior of the rack enclosure.

6. The semiconductor die fabrication system of claim 5, wherein:

the transport system comprises a coupler that cooperates with a head provided to the at least one of the tray cassettes or the at least one of the boat magazines to couple the at least one of the tray cassettes or the at least one of the boat magazines to the transport system, and the head cooperates with the overhead hoist transfer system to couple the at least one of the tray cassettes or the at least one of the boat magazines to the overhead hoist transfer system.

7. The semiconductor die fabrication system of claim 1 comprising:
a first sorter load port that extends between the rack enclosure and the first sorter, wherein the tray cassettes are introduced to the first sorter through the first sorter load port; and
a second sorter load port that extends between the rack enclosure and the second sorter, wherein the boat magazines are introduced to the second sorter through the second sorter load port.

8. The semiconductor die fabrication system of claim 1, wherein:
the first guide comprises a first kinematic coupling interface that cooperates with a kinematic coupling base of the donor tray cassette to establish a defined position of the donor tray cassette relative to the first sorter.

9. The semiconductor die fabrication system of claim 1, wherein the second sorter comprises:
a third guide that maintains a position of one of the boat magazines on the second sorter.

10. The semiconductor die fabrication system of claim 9, wherein:
the third guide comprises a first set of tapered surfaces that cooperate with a base portion of the one of the boat magazines to establish a defined position of the one of the boat magazines relative to the second sorter.

11. The semiconductor die fabrication system of claim 1, comprising:
a scanner that interrogates a computer-readable code associated with the donor tray cassette to identify the at least one of the first tray or the second tray to be transferred between the donor tray cassette and the recipient tray cassette; and
control circuitry that modifies a record maintained in a database as a result of the computer-readable code being interrogated by the scanner to indicate that the at least one of the first tray or the second tray has been transferred from the donor tray cassette to the recipient tray cassette.

12. The semiconductor die fabrication system of claim 11, wherein the scanner comprises a barcode reader comprising an optical image capture device that is positioned relative to the first sorter to detect a barcode applied to a die support that is comprised within the donor tray cassette.

13. A method of storing tray cassettes and boat magazines, the method comprising:
delivering, by an overhead hoist transfer system, the tray cassettes and the boat magazines to a load port of a rack enclosure of a die stocker;
receiving first data indicating that the tray cassettes are to be stored by the die stocker;
based on the first data, controlling operation of a transport system to transport the tray cassettes between the load port through which the tray cassettes are introduced to the rack enclosure of the die stocker, and first storage cells of the rack enclosure configured to receive and store the tray cassettes;
receiving second data indicating that boat magazines are to be stored by the die stocker;
based on the second data, controlling operation of the transport system to transport the boat magazines between the load port through which the boat magazines are introduced to the rack enclosure, and second storage cells of the die stocker configured to receive and store the boat magazines;
in response to receiving an instruction to transfer a first semiconductor die from a donor tray cassette of the tray cassettes to a recipient tray cassette of the tray cassettes, controlling the transport system to transport the donor tray cassette and the recipient tray cassette from the first storage cells to a first sorter load port of the rack enclosure through which the donor tray cassette and the recipient tray cassette are delivered to a first sorter that transfers a first tray comprising the first semiconductor die between the donor tray cassette and the recipient tray cassette, wherein transferring the first tray comprising the first semiconductor die between the donor tray cassette and the recipient tray cassette comprises:
retrieving, using a shuttle, the first tray from the donor tray cassette installed on a first guide; and
moving, using a shuttle rail, the shuttle from a first location proximate the first guide to a second location proximate a second guide having installed thereon the recipient tray cassette to deliver the first tray to the recipient tray cassette; and
in response to receiving an instruction to transfer a second semiconductor die from a donor boat magazine of the boat magazines to a recipient boat magazine of the boat magazines, controlling the transport system to transport the donor boat magazine and the recipient boat magazine from the second storage cells to a second sorter load port of the rack enclosure through which the donor boat magazine and the recipient boat magazine are delivered to a second sorter that transfers a first boat comprising the second semiconductor die between the donor boat magazine and the recipient boat magazine.

14. The method of claim 13, wherein controlling operation of the transport system to transport the tray cassettes between the load port and first storage cells comprises:
connecting an arm of the transport system to a transport head of the tray cassettes, wherein the transport head of the tray cassettes is engaged by an overhead transport system that delivers the tray cassettes to the load port of the rack enclosure; and
carrying the tray cassettes by the transport head to the first storage cells.

15. The method of claim 13, comprising:
interrogating a computer-readable code associated with the donor tray cassette to identify the first tray to be transferred between the donor tray cassette and the recipient tray cassette; and
modifying a record maintained in a database as a result of the computer-readable code being interrogated to indicate that the first tray has been transferred from the donor tray cassette to the recipient tray cassette.

16. A semiconductor die fabrication system comprising:
tray cassettes that store a first tray and a second tray, the second tray being stacked on top of, and supported by the first tray within the tray cassettes;
boat magazines that store a first boat and a second boat, the first boat being supported by a first flange within the boat magazines, and the second boat being supported by a second flange within the boat magazines, vertically above and spaced apart from the first boat within the boat magazines;

a rack enclosure comprising a plurality of storage cells that receive and store the tray cassettes and the boat magazines, a load port through which the tray cassettes and the boat magazines are introduced to an interior of the rack enclosure, and a transport system for transporting the tray cassettes and the boat magazines within the rack enclosure between the load port and the storage cells, wherein the transport system comprises a coupler configured to be received into a space between a top surface of at least one of the tray cassettes or the boat magazines and a head of the at least one of the tray cassettes or the boat magazines;

an overhead hoist transfer system that delivers the tray cassettes and the boat magazines to the load port of the rack enclosure;

a first sorter that receives the tray cassettes, and transfers the first tray or the second tray between the tray cassettes, wherein the first sorter comprises:
- a shuttle configured to retrieve at least one of the first tray or the second tray from a donor tray cassette of the tray cassettes installed on a first guide, and
- a shuttle rail configured to move the shuttle from a first location proximate the first guide to a second location proximate a second guide having installed thereon a recipient tray cassette of the tray cassettes, wherein the shuttle is configured to deliver the at least one of the first tray or the second tray to the recipient tray cassette; and a second sorter that receives the boat magazines, and transfers the first boat or the second boat between the boat magazines.

17. The semiconductor die fabrication system of claim 16, wherein the second sorter comprises:
- a third guide that maintains a position of the first boat or the second boat on the second sorter.

18. The semiconductor die fabrication system of claim 17, wherein:
- the third guide comprises a first set of tapered surfaces that cooperate with a base portion of the first boat or the second boat to establish a defined position of the first boat or the second boat relative to the second sorter.

19. The semiconductor die fabrication system of claim 16 comprising:
- a first sorter load port that extends between the rack enclosure and the first sorter, wherein the tray cassettes are introduced to the first sorter through the first sorter load port; and
- a second sorter load port that extends between the rack enclosure and the second sorter, wherein the boat magazines are introduced to the second sorter through the second sorter load port.

20. The semiconductor die fabrication system of claim 16, comprising:
- a scanner that interrogates a computer-readable code associated with the tray cassettes or the boat magazines to identify semiconductor dies to be transferred between the tray cassettes or between the boat magazines; and
- control circuitry that modifies a record maintained in a database as a result of the computer-readable code being interrogated by the scanner to indicate that the semiconductor dies have been transferred between the tray cassettes or between the boat magazines.

\* \* \* \* \*